June 1, 1971 A. KUNERT ET AL 3,582,324

CONTACT PIECE FOR A SEMICONDUCTOR

Filed June 28, 1968

3,582,324
CONTACT PIECE FOR A SEMICONDUCTOR
Alfred Kunert, Nuremberg, Eugen Szabo de Bucs, Erlangen, and Gerhard Oesterhelt, Nuremberg, Germany, assignors to Siemens Aktiengesellschaft, Berlin and Munich, Germany
Filed June 28, 1968, Ser. No. 741,078
Claims priority, application Germany, July 1, 1967, P 15 58 644.4; Mar. 23, 1968, P 17 58 044.8
Int. Cl. C22c *31/00;* H01v *1/16*
U.S. Cl. 75—134 59 Claims

ABSTRACT OF THE DISCLOSURE

The invention relates to a contact piece for a semiconductor, wherein silicon constitutes an alloying component of the semiconductor and of the contact piece, and to a method of its production. The contact piece is primarily used for contacting semiconductor bodies in thermoelectric devices, particularly thermogenerators and has the general composition:

$$(Me^{I}_{y}\,Me^{II}_{1-y})_{x}\,Si_{1-x}$$

Figures 1, 2:
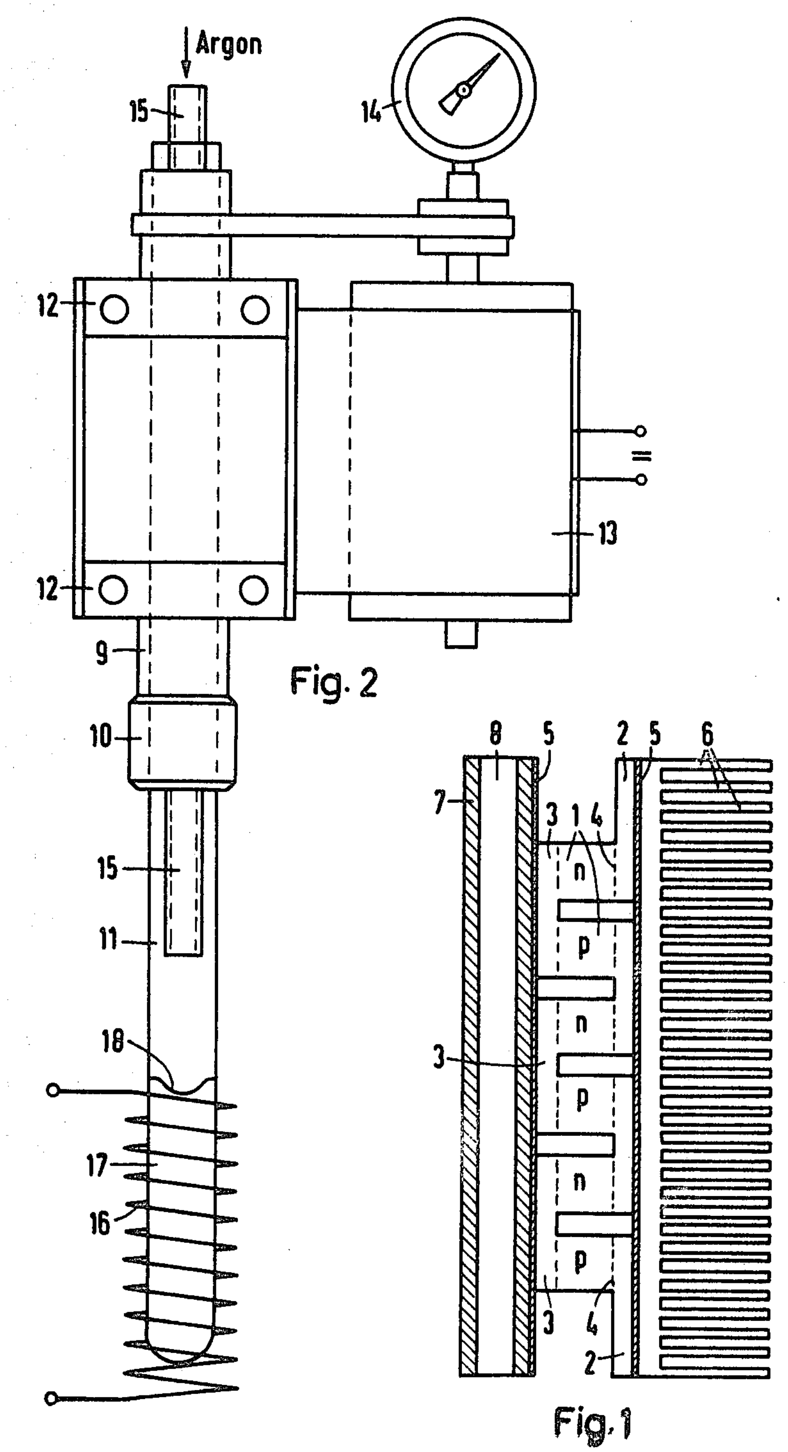

wherein $0.5 \leqslant y \leqslant 0.9$ and $0.05 \leqslant x \leqslant 0.35$ and $Me^{I}$ and $Me^{II}$ are each a metal of the IV, V, VI, VII or VIII secondary groups of the periodic table with the exception of technetium.

Our invention relates to a contact piece for a semiconductor, wherein silicon constitutes an alloying component of the semiconductor and of the contact piece. The contact piece is primarily used for contacting semiconductor bodies in thermoelectric devices, particularly thermogenerators.

Contact pieces which serve as terminals for electric leads or which form a part of a contact bridge for the thermocouple legs should have an expansion coefficient as close as possible to the semiconductor material, so as to avoid too much mechanical tension during a temperature change in the contact. The contact piece must have a high tensile strength and a high stability with respect to heat and temperature changes. It must also be corrosion-resistant against an aggressive atmosphere. Furthermore, no redoping must be effected through the contacting of the semiconductor body with the contact piece. If the contact piece is to be used as a contact bridge in a thermogenerator, it must have high electrical and thermal conductivity since the efficiency of a thermogenerator, among other things, depend upon these values.

From a publication by U. Birkholz in "Physikertagung" (Congress of Physicists) 1965, Frankfurt am Main, published by Teubner, Stuttgart, pgs. 103 to 107, one is famil iar with the use of highly doped silicon, as contact bridges for germaniuim-silicon semiconductor bodies serving as thermo-couple legs in a thermogenerator. Highly doped silicon, however, is very vulnerable to breakage. Furthermore, materials of opposite coating come into contact within the contact region while the thermo-couple legs are molten onto the contact bridge. This may compensate the charge carriers in the contacting region. The latter then appears undoped and increases the inner resistance and considerably reduces the effectiveness of the components. This effect may even lead to the formation of p-n blocking layers and thus to an interruption of the current path.

It is known to use contact bridges, produced of molybdenum-silicon or tungsten-silicon alloy, in thermo-couple legs, which are comprised of a germanium-silicon alloys, e.g. from the Belgium Pat. 681,655. These contact bridges largely meet the above-mentioned requirements placed upon a contact piece. An adverse effect is produced during the production of the alloys by the high melting point of the molybdenum and the tungsten. Because of these high melting points, the silicon evaporates off during the alloying of the silicon with molybdenum or tungsten. A specific composition of the alloy is therefore associated with great difficulties. This means, though, that the adjustment of the expansion coefficient of the contact piece to the expansion coefficient of the semiconductor material remains inexact and the contacting is threatened by mechanical stresses, which may occur during a change in temperature. Thus, a necessity exists to produce a contact piece of a material which meets the aforementioned requirements and which does not entail the indicated disadvantages.

In accordance with the present invention, the problem is solved by giving the material for the contact piece the general composition:

$$(Me^{I}_{y}\,Me^{II}_{1-y})_{x}\,Si_{1-x}$$

wherein $0.5 \leqslant y \leqslant 0.9$ and $0.05 \leqslant x \leqslant 0.35$ and $Me^{I}$ and $Me^{II}$ are each a metal of the IV, V, VI, VII or VIII secondary groups of the periodic table with the exception of technetium.

Preferably, the mixing ratio of the alloying components $Me^{I}$ and $Me^{II}$ corresponds at least approximately to an eutectic or dystectic point of the melting diagram and the mixing ratio of the dimetal-silicon alloy has an expansion coefficient, which corresponds at least approximately with the expansion coefficient of the semiconductor material.

The contact pieces of the present invention fulfills all indicated requirements. Most particularly it possesses great strength and breaking resistance, due to its metallic component. Mixing ratios of the aforementioned type are very favorable. Dystectics may be expedient, if the contact piece is to have a higher melting point. The contact pieces are especially well suited for use in thermogenerators. Tests have shown that thermocouple legs, which were contacted with a contact piece according to the present invention, can easily be operated at above 1000° C. Since the effectiveness of a thermogenerator depends also on the temperature of the heat source, a high degree of efficiency may be obtained with the contact piece of the present invention.

In order to increase the electrical conductivity with which an optimation of the effectiveness of a thermogenerator is connected, it is preferred to select one of the metals tungsten or molybdenum as the metal $Me^{I}$ with $0.65 \leqslant y \leqslant 0.75$.

The following Tables 1 to 3 list contact materials, according to the present invention. In the first line of these tables is the semiconductor material to whose expansion coefficient, the expansion coefficient of the respective contact bridge material has been adjusted.

TABLE 1

| | | Melting point [° C.] | Linear expansion coefficient $\alpha[10^{-5}\ °\ C.^{-1}]$ | Heat conductivity $\mathcal{H}$ [cal·s$^{-1}$ cm.$^{-1}$ ° C.$^{-1}$] | Electrical conductivity relating to $Ge_{0.3}Si_{0.7}$ | Oxidation resistance at 1,000° C. |
|---|---|---|---|---|---|---|
| 1 | $Ge_{0.3}Si_{0.7}$ | ~1,330 | 0.51 | 0.01 | (1) | Good. |
| 2 | $(Ti_{0.55}Mo_{0.45})_{0.18}Si_{0.82}$ | 1,500 | 0.51 | 0.20 | 120 | Do. |
| 3 | $(Zr_{0.9}W_{0.1})_{0.35}Si_{0.65}$ | 1,940 | 0.51 | 0.15 | 300 | Moderate. |
| 4 | $(Hf_{0.81}Re_{0.19})_{0.33}Si_{0.67}$ | 1,650 | 0.51 | 0.16 | 200 | Do. |
| 5 | $(V_{0.51}Mo_{0.49})_{0.2}Si_{0.8}$ | 1,700 | 0.51 | 0.20 | 170 | Average. |
| 6 | $(Nb_{0.67}Pd_{0.33})_{0.1}Si_{0.9}$ | 1,620 | 0.51 | 0.19 | 120 | Good. |
| 7 | $(Ta_{0.6}Ni_{0.4})_{0.1}Si_{0.9}$ | 1,620 | 0.51 | 0.20 | 120 | Do. |
| 8 | $(Cr_{0.6}Mo_{0.4})_{0.35}Si_{0.65}$ | 1,560 | 0.51 | 0.21 | 400 | Do. |
| 9 | $(Mo_{0.55}Ti_{0.45})_{0.2}Si_{0.8}$ | 1,600 | 0.51 | 0.20 | 120 | Do. |
| 10 | $(Mo_{0.78}Nb_{0.22})_{0.2}Si_{0.8}$ | 1,700 | 0.51 | 0.22 | 550 | Do. |
| 11 | $(W_{0.51}Ni_{0.49})_{0.1}Si_{0.9}$ | 1,475 | 0.51 | 0.21 | 200 | Do. |
| 12 | $(Fe_{0.63}Mo_{0.37})_{0.1}Si_{0.9}$ | 1,560 | 0.51 | 0.20 | 140 | Average. |
| 13 | $(Co_{0.54}W_{0.46})_{0.1}Si_{0.9}$ | 1,300 | 0.51 | 0.21 | 200 | Good. |
| 14 | $(Ni_{0.72}Re_{0.28})_{0.1}Si_{0.9}$ | 1,580 | 0.51 | 0.20 | 100 | Do. |
| 15 | $(Ru_{0.71}Ta_{0.29})_{0.11}Si_{0.89}$ | 1,520 | 0.51 | ---------- | 190 | Average. |
| 16 | $(Rh_{0.65}Mo_{0.35})_{0.18}Si_{0.82}$ | 1,830 | 0.51 | 0 23 | 400 | Good. |
| 17 | $Pd_{0.58}Mo_{0.42})_{0.1}Si_{0.9}$ | 1,590 | 0.51 | 0.20 | 190 | Do. |
| 18 | $(Ir_{0.6}Ti_{0.4})_{0.17}Si_{0.83}$ | 1,820 | 0.51 | 0.21 | 130 | Do. |
| 19 | $(Pt_{0.582}Ti_{0.418})_{0.11}Si_{0.89}$ | 1,600 | 0.51 | 0.19 | 100 | Do. |
| 20 | $(Mo_{0.67}Zr_{0.33})_{0.35}Si_{0.65}$ | 1,980 | 0.51 | 0.22 | 500 | Moderate. |
| 21 | $(Mo_{0.67}Hf_{0.33})_{0.33}Si_{0.67}$ | 1,650 | 0.51 | 0.21 | 400 | Do. |
| 22 | $(Cr_{0.9}V_{0.1})_{0.25}Si_{0.75}$ | 1,480 | 0.51 | 0.19 | 250 | Do. |
| 23 | $(Cr_{0.87}Ta_{0.13})_{0.26}Si_{0.74}$ | 1,470 | 0.51 | 0.19 | 250 | Good. |
| 24 | $(Co_{0.545}Cr_{0.455})_{0.1}Si_{0.9}$ | 1,400 | 0.51 | 0.20 | 110 | Do. |
| 25 | $(Co_{0.54}Mo_{0.46})_{0.1}Si_{0.9}$ | 1,575 | 0.51 | 0.20 | 200 | Do. |
| 26 | $(Pd_{0.815}W_{0.185})_{0.1}Si_{0.9}$ | 1,640 | 0.51 | 0.20 | 120 | Do. |
| 27 | $(V_{0.85}Mn_{0.15})_{0.1}Si_{0.9}$ | 1,600 | 0.51 | ---------- | 80 | Average. |
| 28 | $(Fe_{0.6}Re_{0.4})_{0.1}Si_{0.9}$ | 1,600 | 0.51 | 0.20 | 110 | Do. |
| 29 | $(Nb_{0.76}Fe_{0.24})_{0.11}Si_{0.89}$ | 1,600 | 0.51 | 0.19 | 110 | Do. |
| 30 | $(Hf_{0.762}Co_{0.238})_{0.13}Si_{0.87}$ | 1,300 | 0.51 | 0.18 | 90 | Do. |
| 31 | $(Zr_{0.67}Ni_{0.33})_{0.14}Si_{0.86}$ | 1,570 | 0.51 | 0.19 | 100 | Do. |
| 32 | $(Mo_{0.584}Ru_{0.416})_{0.18}Si_{0.82}$ | 1,780 | 0.51 | ---------- | 300 | Do. |
| 33 | $(Mo_{0.61}Rh_{0.39})_{0.21}Si_{0.79}$ | 1,780 | 0.51 | 0.23 | 400 | Good. |
| 34 | $(Cr_{0.6}Pd_{0.4})_{0.12}Si_{0.88}$ | 1,550 | 0.51 | 0.20 | 110 | Do. |
| 35 | $(Ta_{0.52}Os_{0.48})_{0.35}Si_{0.65}$ | 1,800 | 0.51 | ---------- | 300 | Do. |
| 36 | $(Ti_{0.81}Ir_{0.19})_{0.12}Si_{0.88}$ | 1,550 | 0.51 | 0.19 | 90 | Do. |
| 37 | $(Zr_{0.79}Pt_{0.21})_{0.35}Si_{0.65}$ | 1,360 | 0.51 | 0.16 | 300 | Do. |
| 38 | $(Mo_{0.7}Fe_{0.3})_{0.2}Si_{0.8}$ | 1,640 | 0.52 | 0.22 | 250 | Average. |
| 39 | $(Mo_{0.75}Co_{0.25})_{0.18}Si_{0.82}$ | 1,620 | 0.52 | 0.22 | 500 | Good. |
| 40 | $(Mo_{0.67}Co_{0.33})_{0.12}Si_{0.88}$ | 1,500 | 0.51 | 0.21 | 350 | Very good. |
| 41 | $(Mo_{0.75}Ni_{0.25})_{0.2}Si_{0.8}$ | 1,610 | 0.52 | 0.22 | 450 | Good. |
| 42 | $(Mo_{0.7}Ni_{0.3})_{0.17}Si_{0.83}$ | 1,600 | 0.52 | 0.21 | 350 | Do. |
| 43 | $(Mo_{0.75}Pd_{0.25})_{0.22}Si_{0.78}$ | 1,660 | 0.52 | 0.22 | 300 | Do. |
| 44 | $(Mo_{0.67}Pd_{0.33})_{0.16}Si_{0.84}$ | 1,550 | 0.51 | 0.21 | 250 | Very good. |
| 45 | $(W_{0.67}Fe_{0.33})_{0.2}Si_{0.8}$ | 1,680 | 0.51 | 0.23 | 250 | Average. |
| 46 | $(W_{0.75}Co_{0.25})_{0.2}Si_{0.8}$ | 1,770 | 0.51 | 0.23 | 600 | Do. |
| 47 | $(W_{0.67}Co_{0.33})_{0.14}Si_{0.86}$ | 1,620 | 0.51 | 0.22 | 350 | Good. |
| 48 | $(W_{0.75}Ni_{0.25})_{0.23}Si_{0.77}$ | 1,750 | 0.51 | 0.24 | 550 | Average. |
| 49 | $(W_{0.67}Ni_{0.33})_{0.16}Si_{0.84}$ | 1,675 | 0.51 | 0.22 | 400 | Good. |
| 50 | $(W_{0.75}Pd_{0.25})_{0.25}Si_{0.75}$ | 1,700 | 0.51 | 0.24 | 400 | Do. |
| 51 | $(W_{0.67}Pd_{0.33})_{0.2}Si_{0.8}$ | 1,700 | 0.51 | 0.23 | 300 | Do. |

[1] ~1,000 [Ω·cm.$^{-1}$]=100%.

TABLE 2

| | | Melting point (° C.) | Linear expansion coefficient $\alpha[10^{-5}\ °\ C.^{-1}]$ | Heat conductivity $\mathcal{H}$ [cal·s$^{-1}$ cm.$^{-1}$ ° C.$^{-1}$] | Oxidation resistance at 1,000° C. |
|---|---|---|---|---|---|
| 1 | $FeSi_2$ | 1,210 | 0.67 | ---------- | Moderate. |
| 2 | $(W_{0.51}Nl_{0.49})_{0.13}Si_{0.87}$ | 1,500 | 0.67 | 0.21 | Good. |
| 3 | $(Ti_{0.55}Mo_{0.45})_{0.234}Si_{0.766}$ | 1,530 | 0.67 | 0.19 | Do. |
| 4 | $(Mo_{0.78}Nb_{0.22})_{0.26}Si_{0.74}$ | 1,750 | 0.67 | 0.22 | Do. |

TABLE 3

| | | Melting point (° C.) | Linear expansion coefficient $\alpha[10^{-5}\ °\ C.^{-1}]$ | Heat conductivity $\mathcal{H}$ [cal·s$^{-1}$ cm.$^{-1}$ ° C.$^{-1}$] | Oxidation resistance at 1,000° C. |
|---|---|---|---|---|---|
| 1 | MnSi | 1,275 | 1.63 | ---------- | Average. |
| 2 | $(Pd_{0.58}Mo_{0.42})_{0.32}Si_{0.68}$ | 1,600 | 1,63 | 0.21 | Good. |
| 3 | $(Co_{0.54}W_{0.46})_{0.32}Si_{0.68}$ | 1,500 | 1.63 | 0.22 | Do. |
| 4 | $(W_{0.51}Ni_{0.49})_{0.32}Si_{0.68}$ | 1,550 | 1.63 | 0.24 | Do |

To demonstrate the advantages of the contact piece material, in accordance with the invention, Tables 1 to 3 list the melting point, the linear expansion coefficient $\alpha$, the heat conductivity $\mathcal{H}$ and also indications concerning the electrical conductivity and the oxidation resistance. The indicated values may vary by 5%. In the case of the expansion coefficient, however, the variations are below 1%. A median value was given for the electrical conductivity of an alloy $Ge_{0.3}Si_{0.7}$, depending on the doping. It is seen from Table 1 that the electrical conductivity of some of the materials according to the present invention is considerably better than that of the semiconductor bodies being used. The electrical conductivity of the examples (39), (41), (46), and (48) exceeds the average conductivity value of the alloys. This high conductivity value was obtained by increasing the content of heavy metal of Mo and W. The table also shows that this does not impair the other values.

To produce a contact piece according to the present invention, the metals $Me^{I}$ and $Me^{II}$ are fused at an appropriate mixing ratio and subsequently the dimetal alloy is molten at least once with silicon, in a suitable mixing ratio. Contact pieces with a desired shape may be mechanically severed from the solidified melt. The latter may also be broken up and the contact pieces may be obtained in a desired shape, by means of powder compression sintering.

The advantage of the described production method is in the melting of the dimetal alloy. The melting point of said dimetal alloy is generally close to the melting point of the silicon. This fact is illustrated in Table 4, which lists the melting points of the dimetal alloys shown as alloying components in Tables 1, 2 and 3. The numbers in the examples given in Table 4 correspond to the numbers in the examples found in Table 1.

TABLE 4

| | | Melting point, ° C. | Melting point, $Me^{I}$ ° C. | Melting point $Me^{II}$ ° C. |
|---|---|---|---|---|
| 1 | Si | 1,415 | | |
| 2 | $Ti_{0.55}Mo_{0.45}$ | 2,080 | 1,690 (Ti) | 2,610 (Mo) |
| 3 | $Zr_{0.9}W_{0.1}$ | 1,660 | 1,852 (Zr) | 3,380 (W) |
| 4 | $Hf_{0.81}Re_{0.19}$ | 1,880 | 2,222 (Hf) | 3,180 (Re) |
| 5 | $V_{0.51}Mo_{0.49}$ | 2,000 | 1,857 (V) | 2,610 (Mo) |
| 6 | $Nb_{0.67}Pd_{0.33}$ | 1,970 | 2,497 (Nb) | 1,550 (Pd) |
| 7 | $Ta_{0.6}Ni_{0.4}$ | 2,000 | 2,997 (Ta) | 1,452 (Ni) |
| 8 | $Cr_{0.6}Mo_{0.4}$ | 2,060 | 1,903 (Cr) | 2,610 (Mo) |
| 9 | $Mo_{0.55}Ti_{0.45}$ | 2,170 | 2,610 (Mo) | 1,690 (Ti) |
| 10 | $Mo_{0.78}Nb_{0.22}$ | 2,345 | 2,610 (Mo) | 2,497 (Nb) |
| 11 | $W_{0.51}Ni_{0.49}$ | 1,800 | 3,380 (W) | 1,452 (Ni) |
| 12 | $Fe_{0.63}Mo_{0.37}$ | 1,540 | 1,539 (Fe) | 2,610 (Mo) |
| 13 | $Co_{0.54}W_{0.46}$ | 2,080 | 1,495 (Co) | 3,380 (W) |
| 14 | $Ni_{0.72}Re_{0.28}$ | 1,600 | 1,452 (Ni) | 3,180 (Re) |
| 15 | $Ru_{0.71}Ta_{0.29}$ | 1,970 | 2,427 (Ru) | 2,997 (Ta) |
| 16 | $Rh_{0.65}Mo_{0.35}$ | 2,075 | 1,966 (Rh) | 2,610 (Mo) |
| 17 | $Pd_{0.58}Mo_{0.42}$ | 1,740 | 1,550 (Pd) | 2,610 (Mo) |
| 18 | $Ir_{0.6}Ti_{0.4}$ | 2,000 | 2,454 (Ir) | 1,690 (Ti) |
| 19 | $Pt_{0.582}Ti_{0.418}$ | 1,780 | 1,770 (Pt) | 1,690 (Ti) |
| 20 | $Mo_{0.67}Zr_{0.33}$ | 2,070 | 2,610 (Mo) | 1,852 (Zr) |
| 21 | $Mo_{0.67}Hf_{0.33}$ | 2,280 | 2,610 (Mo) | 2,222 (Hf) |
| 22 | $Cr_{0.9}V_{0.1}$ | 1,765 | 1,903 (Cr) | 1,857 (V) |
| 23 | $Cr_{0.87}Ta_{0.13}$ | 1,700 | 1,903 (Cr) | 2,997 (Ta) |
| 24 | $Co_{0.545}Cr_{0.455}$ | 1,400 | 1,495 (Co) | 1,903 (Cr) |
| 25 | $Co_{0.54}Mo_{0.46}$ | 1,550 | 1,495 (Co) | 2,610 (Mo) |
| 26 | $Pd_{0.815}W_{0.185}$ | 2,175 | 1,550 (Pd) | 3,380 (W) |
| 27 | $V_{0.85}Mn_{0.15}$ | 1,800 | 1,857 (V) | 1,311 (Mn) |
| 28 | $Fe_{0.6}Re_{0.4}$ | 1,800 | 1,539 (Fe) | 3,180 (Re) |
| 29 | $Nb_{0.76}Fe_{0.24}$ | 1,680 | 2,497 (Nb) | 1,539 (Fe) |
| 30 | $Hf_{0.762}Co_{0.238}$ | 1,212 | 2,222 (Hf) | 1,495 (Co) |
| 31 | $Zr_{0.67}Ni_{0.33}$ | 1,200 | 1,852 (Zr) | 1,452 (Ni) |
| 32 | $Mo_{0.584}Ru_{0.416}$ | 1,945 | 2,610 (Mo) | 2,427 (Ru) |
| 33 | $Mo_{0.61}Rh_{0.39}$ | 1,940 | 2,610 (Mo) | 1.966 (Rh) |
| 34 | $Cr_{0.6}Pd_{0.4}$ | 1,398 | 1.903 (Cr) | 1,550 (Pd) |
| 35 | $Ta_{0.52}Os_{0.48}$ | 2,360 | 2,997 (Ta) | 2,700 (Os) |
| 36 | $Ti_{0.81}Ir_{0.19}$ | 1.475 | 1,690 (Ti) | 2,454 (Ir) |
| 37 | $Zr_{0.79}Pt_{0.21}$ | 1,185 | 1.852 (Zr) | 1,770 (Pt) |
| 38 | $Mo_{0.7}Fe_{0.3}$ | 2,250 | 2,160 (Mo) | 1,539 (Fe) |
| 39 | $Mo_{0.75}Co_{0.25}$ | 2,150 | 2,610 | 1,495 (Co) |
| 40 | $Mo_{0.67}Co_{0.33}$ | 2,030 | 2,610 | 1,495 |
| 41 | $Mo_{0.75}Ni_{0.25}$ | 1,830 | 2,610 | 1,452 (Ni) |
| 42 | $Mo_{0.7}Ni_{0.3}$ | 1,800 | 2,610 | 1,452 |
| 43 | $Mo_{0.75}Pd_{0.25}$ | 2,240 | 2,610 | 1,550 (Pd) |
| 44 | $Mo_{0.67}Pd_{0.33}$ | 2,100 | 2.610 | 1,550 |
| 45 | $W_{0.67}Fe_{0.33}$ | 2,300 | 3,380 (W) | 1,539 (Fe) |
| 46 | $W_{0.75}Co_{0.25}$ | 3,000 | 3,380 | 1,495 (Co) |
| 47 | $W_{0.67}Co_{0.33}$ | 2,800 | 3,380 | 1,495 |
| 48 | $W_{0.75}Ni_{0.25}$ | 2,000 | 3,380 | 1,452 (Ni) |
| 49 | $W_{0.67}Ni_{0.33}$ | 1,920 | 3,380 | 1,452 |
| 50 | $W_{0.75}Pd_{0.25}$ | 3,180 | 3,380 | 1,550 (Pd) |
| 51 | $W_{0.67}Pd_{0.33}$ | 3,100 | 3,380 | 1,550 |

The melting points of metal $Me^{I}$ and $Me^{II}$ are listed in the last two columns of the table. The melting point of silicon is indicated as a comparison example (1). The table shows that the melting point of the dimetal alloys is always considerably less than the highest melting point of the respective metals $Me^{I}$ or $Me^{II}$. In the examples (3), (4), etc., the melting point of the dimetal alloy is even lower than the melting point of the two metals. Since the melting point of the dimetal alloy and the melting point of the silicon are no longer very different, the silicon component will not escape during fusion. Hence, it is quite feasible in case of contact materials of the present invention, to effect an exact adjustment of their expansion coefficient to the expansion coefficient of the contact material, which is easily accomplished during the production process. A repeated melting of the dimetal component with the silicon, homogenizes the dimetal-silicon alloy, and primarily affects the magnitude of the electrical conductivity, which is optimized through said homogeneity. It might be added, that the adjustment of the expansion coefficient by means of the dimetal alloy, is also beneficial from the point of view that the three components offer wide possibilities of variation in the mixing ratio.

The invention will be disclosed as follows, in greater detail, on hand of an embodiment example which is illustrated by the drawing, in which FIG. 1 shows a thermogenerator and FIG. 2 shows a device for producing the contact piece.

It is preferred to place the dimetal alloy and the silicon into a perpendicularly positioned melting tube which is sealed at the bottom and to melt inductively the material by a high frequency (HF) field. The melting tube is rotated around the tubular axis, at least while the melt solidifies at an r.p.m. such that a depression forms in the surface of the melt, at a depth which, at the most, approaches the radius of the melting tube. During the solidification of the melt, the melting tube may be lowered from the HF field in the direction of the tube axis.

First of all, a good homogenization of the dimetal-silicon is obtained by the above process. But primarily, a rotation under the above-disclosed conditions prevents the formation of tears in the solidified melt, which would normally occur since the expansion coefficient of the contact piece materials according to the present invention is negative. Thus, the materials would expand during said solidification. A rotation at the indicated r.p.m., which results in a depression in the surface of the melt, produces a region of reduced density along the tubular axis of the melting tube. A region of greater density lies along the area of the melting tube wall. The molten alloy may expand into the region of lower density during solidification, and stress conditions, which would result in the formation of tears by release against the lateral wall of the melting tube through pressure, are prevented during solidification.

FIG. 1 shows a thermogenerator whose p- and n-conducting thermocouple legs 1 are conductively connected by electricity at their cold and hot soldering point, by means of contact bridges 3, so that they are electrically in series and thermally in parallel and so that their cold or hot soldering points are in a plane, i.e. the cold- or warm-side of the thermogenerator. Seated upon the contact bridges of the cold and warm-side of the thermogenerator, is a material layer 5 which is heat conductive and electrically insulated and which may be comprised, for example, of aluminum oxide or beryllium oxide. A heat-exchanger 7 mounted upon the warm side of the thermogenerator, is provided with a passage 8 for a hot, liquid heat-exchange medium. A heat-exchanger 6 for a gaseous heat-exchange medium is mounted upon the cold side of the thermogenerator.

The thermocouple legs 1 may be produced of a germanium-silicon alloy, of iron-silicon or of a manganese-silicon alloy. In a germanium-silicon alloy, the p-conducting thermocouple leg is produced e.g. by a doping with boron, gallium or indium and the n-conducting thermocouple leg through doping with phosphorus, arsenic or antimony. The thermocouple legs 1 are contacted with contact pieces 2 and 3 of the present invention, whose mixing ratio is adjusted to the expansion coefficient of the respective semiconductor material. The contact piece 3 is designed as a contact bridge for an electrical connection of two thermocouple legs 1. The electrical energy is derived from the thermogenerator, via contact pieces 2. The material of the contact pieces, respectively contact bridges, is produced in accordance with the method of the invention, whereby the dimetal silicon alloy may be melted in the HF field and/or in the electron beam furnace.

The thermocouple legs 1 may be molten or welded onto the contact pieces 2 or 3. It is favorable, however, to provide a solder layer 4 to connect the thermocouple legs with contact pieces 2 or 3. Particularly preferred is a solder which contains palladium and silicon, as alloying components, and also a third alloying component, which is present as metal $Me^{I}$ or $Me^{II}$ in the alloy of the material of the contact bridges. With the aid of this solder one can obtain a contact zone 4 wherein the contact bridge material is continually converted into the semiconductor material of the thermocouple leg 1.

FIG. 2 shows a device with whose aid the production process of the present invention may be favorably carried out. It is comprised of two portions of which one serves the rotation process and the other is used for heating the charge.

The rotation device contains a rotatable clamping tube 9 with a clamping portion 10, into which the melting tube 11, comprised e.g. of quartz, can be inserted and centrically clamped. Additional cooling, for example by means of an air flow may be provided for the melting tube 11. The clamping tube 9 is guided by ball bearings 12 which are held in a metal box and is driven by means of a motor 13, whose r.p.m. may be regulated. A revolution indicator 14 is used to control the r.p.m. of the melting tube 11. The clamping tube 9 holds an additional tube 15 through which argon is introduced, e.g. in order to produce an inert atmosphere. The heating portion is comprised of a high-frequency induction coil 16, which is fed by a high-frequency generator (not shown). The induction coil is so arranged that it completely encloses the melting charge 17. Each individual pouring is prepared by weighing the appropriate amount of alloy components, dimetal alloy and silicon. The previously well-mixed original material is installed into the melting tube 11 and melted by means of the HF field. It is preferred to start the melting tube 11 rotating even during the melting process so as to ensure a thorough mixing of the alloy. A shaking motion of the melting tube 11 may be provided for an additional improvement of the homogeneity of the melt 17. This is not shown. Following the melting, rotation is continued during the solidifying period, and the melting tube 11 is lowered from the induction coil 16 in the direction of its tube axis.

FIG. 2 shows the depression 18 at the surface of the melting charge 17, which indicates that the number of rotations was properly selected and that a region of reduced density has formed along the tubular axis. The number of rotations depend on the inside diameter of the melting tube 11 and also on the material composition of the charge, due to the viscosity and the temperature of the melt. For example, an alloy of the combination $(Mo_{0.75}Co_{0.25})_{0.18}Si_{0.82}$ may be molten, without tears, in a melting tube 11 with an inside diameter of 12 to 13 mm., at 700 to 800 r.p.m.

Following solidification, the molten piece is taken from the melting tube. The thus produced homogeneous and tear-free alloy is obtained in the shape of a cylindrical body. The contact pieces are cut from this cylinder as wafers or discs. If a special shape is required for the contact pieces, an appropriate after-treatment can be effected.

We claim:

1. Contact piece for a semiconductor body, wherein silicon is an alloying component of the semiconductor and of the contact piece, said contact piece being composed of $$(Me^{I}_{y}\,Me^{II}_{1-y})_{x}\,Si_{1-x}$$

wherein $0.5 \leq y \leq 0.9$ and $0.05 \leq x \leq 0.35$ and $Me^{I}$ and $Me^{II}$ are each a metal selected from the IV, V, VI, VII or VIII secondary groups, including technetium and the mixing ratio of the components of the dimetal silicon alloy has an expansion coefficient, which corresponds at least approximately to the expansion coefficient of the semiconductor material.

2. Contact piece for a semiconductor body, wherein silicon is an alloying component of the semiconductor and of the contact piece, said contact piece being composed of $$(Me^{I}_{y}\,Me^{II}_{1-y})_{x}\,Si_{1-x}$$

wherein $0.5 \leq y \leq 0.9$ and $0.05 \leq x \leq 0.35$ and $Me^{I}$ and $Me^{II}$ are each a metal selected from the IV, V, VI, VII or VIII secondary groups, excluding technetium, the mixing ratio of the alloying components $Me^{I}$ and $Me^{II}$ corresponds at least approximately to an eutectic or dystectic point.

3. A contact piece according to claim 1, which for a germanium-silicon semiconductor body, is composed of $$(Ti_{0.55}Mo_{0.45})_{0.18}Si_{0.82}$$

4. A contact piece according to claim 1, which for a germanium-silicon semiconductor body, is composed of $$(Zr_{0.9}W_{0.1})_{0.35}Si_{0.65}$$

5. A contact piece according to claim 1, which for a germanium-silicon semiconductor body, is composed of $$(Hf_{0.81}Re_{0.19})_{0.33}Si_{0.67}$$

6. A contact piece according to claim 1, which for a germanium-silicon semiconductor body, is composed of $$(Nb_{0.67}Pd_{0.33})_{0.1}Si_{0.9}$$

7. A contact piece according to claim 1, which for a germanium-silicon semiconductor body, is composed of $$(Ta_{0.6}Ni_{0.4})_{0.1}Si_{0.9}$$

8. A contact piece according to claim 1, which for a germanium-silicon semiconductor body, is composed of $$(Cr_{0.6}Mo_{0.4})_{0.35}Si_{0.65}$$

9. A contract piece according to claim 1, which for a germanium-silicon semiconductor body, is composed of $$(Mo_{0.55}Ti_{0.45})_{0.2}Si_{0.8}$$

10. A contact piece according to claim 1, which for a germanium-silicon semiconductor body, is composed of $$(Mo_{0.78}Nb_{0.22})_{0.2}Si_{0.8}$$

11. A contact piece according to claim 1, which for a germanium-silicon semiconductor body, is composed of $$(W_{0.51}Ni_{0.49})_{0.1}Si_{0.9}$$

12. A contact piece according to claim 1, which for a germanium-silicon semiconductor body, is composed of $$(Fe_{0.63}Mo_{0.37})_{0.1}Si_{0.9}$$

13. A contact piece according to claim 1, which for a germanium-silicon semiconductor body, is composed of $$(Co_{0.54}W_{0.46})_{0.1}Si_{0.9}$$

14. A contact piece according to claim 1, which for a germanium-silicon semiconductor body, is composed of $$(Ni_{0.72}Re_{0.28})_{0.1}Si_{0.9}$$

15. A contact piece according to claim 1, which for a germanium-silicon semiconductor body, is composed of $$(Ru_{0.71}Ta_{0.29})_{0.11}Si_{0.89}$$

16. A contact piece according to claim 1, which for a germanium-silicon semiconductor body, is composed of $$(Rh_{0.65}Mo_{0.35})_{0.18}Si_{0.82}$$

17. A contact piece according to claim 1, which for a germanium-silicon semiconductor body, is composed of $$(Pd_{0.58}Mo_{0.42})_{0.1}Si_{0.9}$$

18. A contact piece according to claim 1, which for a germanium-silicon semiconductor body, is composed of $$(Ir_{0.6}Ti_{0.4})_{0.17}Si_{0.83}$$

19. A contact piece according to claim 1, which for a germanium-silicon semiconductor body, is composed of $$(Pt_{0.582}Ti_{0.418})_{0.11}Si_{0.89}$$

20. A contact piece according to claim 1, which for a germanium-silicon semiconductor body, is composed of $$(Mo_{0.67}Zr_{0.33})_{0.35}Si_{0.65}$$

21. A contact piece according to claim 1, which for a germanium-silicon semiconductor body, is composed of $$(Mo_{0.67}Hf_{0.33})_{0.33}Si_{0.67}$$

22. A contact piece according to claim 1, which for a germanium-silicon semiconductor body, is composed of $$(Cr_{0.9}V_{0.1})_{0.25}Si_{0.75}$$

23. A contact piece according to claim 1, which for a germanium-silicon semiconductor body, is composed of $$(Cr_{0.87}Ta_{0.13})_{0.26}Si_{0.74}$$

24. A contact piece according to claim 1, which for a germanium-silicon semiconductor body, is composed of $$(Co_{0.545}Cr_{0.455})_{0.1}Si_{0.9}$$

25. A contact piece according to claim 1, which for a germanium-silicon semiconductor body, is composed of $$(Co_{0.54}Mo_{0.46})_{0.1}Si_{0.9}$$

26. A contact piece according to claim 1, which for a germanium-silicon semiconductor body, is composed of $$(Pd_{0.815}W_{0.185})_{0.1}Si_{0.9}$$

27. A contact piece according to claim 1, which for a germanium-silicon semiconductor body, is composed of $$(Vo_{0.85}Mn_{0.15})_{0.1}Si_{0.9}$$

28. A contact piece according to claim 1, which for a germanium-silicon semiconductor body, is composed of $$(Fe_{0.6}Re_{0.4})_{0.1}Si_{0.9}$$

29. A contact piece according to claim 1, which for a germanium-silicon semiconductor body, is composed of $$(Nb_{0.76}Fe_{0.24})_{0.11}Si_{0.89}$$

30. A contact piece according to claim 1, which for a germanium-silicon semiconductor body, is composed of $$(Hf_{0.762}Co_{0.238})_{0.13}Si_{0.87}$$

31. A contact piece according to claim 1, which for a germanium-silicon semiconductor body, is composed of $$(Zr_{0.67}Ni_{0.33})_{0.14}Si_{0.86}$$

32. A contact piece according to claim 1, which for a germanium-silicon semiconductor body, is composed of $$(Mo_{0.584}Ru_{0.416})_{0.18}Si_{0.82}$$

33. A contact piece according to claim 1, which for a germanium-silicon semiconductor body, is composed of $$(Mo_{0.61}Rh_{0.39})_{0.21}Si_{0.79}$$

34. A contact piece according to claim 1, which for a germanium-silicon semiconductor body, is composed of $$(Cr_{0.6}Pd_{0.4})_{0.12}Si_{0.88}$$

35. A contact piece according to claim 1, which for a germanium-silicon semiconductor body, is composed of $$(Ta_{0.52}Os_{0.48})_{0.35}Si_{0.65}$$

36. A contact piece according to claim 1, which for a germanium-silicon semiconductor body, is composed of $$(Ti_{0.81}Ir_{0.19})_{0.12}Si_{0.88}$$

37. A contact piece according to claim 1, which for a germanium-silicon semiconductor body, is composed of $$(Zr_{0.79}Pt_{0.21})_{0.35}Si_{0.65}$$

38. A contact piece as in claim 1, wherein for a germanium-silicon semiconductor body, $Me^{I}$ is a metal selected from tungsten and molybdenum and $0.65 \leqslant y \leqslant 0.75$.

39. A contact piece according to claim 38, which is composed of $$(Mo_{0.7}Fe_{0.3})_{0.2}Si_{0.8}$$

40. A contact piece according to claim 38, which is composed of $$(Mo_{0.75}Co_{0.25})_{0.18}Si_{0.82}$$

41. A contact piece according to claim 38, which is composed of $$(Mo_{0.67}Co_{0.33})_{0.12}Si_{0.88}$$

42. A contact piece according to claim 38, which is composed of $$(Mo_{0.75}Ni_{0.25})_{0.2}Si_{0.8}$$

43. A contact piece according to claim 38, which is composed of $$(Mo_{0.7}Ni_{0.3})_{0.17}Si_{0.83}$$

44. A contact piece according to claim 38, which is composed of $$(Mo_{0.75}Pd_{0.25})_{0.22}Si_{0.78}$$

45. A contact piece according to claim 38, which is composed of $$(Mo_{0.67}Pd_{0.33})_{0.16}Si_{0.84}$$

46. A contact piece according to claim 38, which is composed of $$(W_{0.67}Fe_{0.33})_{0.2}Si_{0.9}$$

47. A contact piece according to claim 38, which is composed of $$W_{0.75}Co_{0.25})_{0.2}Si_{0.8}$$

48. A contact piece according to claim 38, which is composed of $$(W_{0.67}Co_{0.33})_{0.14}Si_{0.86}$$

49. A contact piece according to claim 38, which is composed of $$(W_{0.75}Ni_{0.25})_{0.23}Si_{0.77}$$

50. A contact piece according to claim 38, which is composed of $$(W_{0.67}Ni_{0.33})_{0.16}Si_{0.84}$$

51. A contact piece according to claim 38, which is composed of $$(W_{0.75}Pd_{0.25})_{0.25}Si_{0.75}$$

52. A contact piece according to claim 38, which is composed of $$(W_{0.51}Ni_{0.49})_{0.13}Si_{0.87}$$

53. A contact piece according to claim 1, which for a $FeSi_2$ semiconductor body, is composed of $$(W_{0.51}Ni_{0.49})_{0.13}Si_{0.87}$$

54. A contact piece according to claim 1, which for a $FeSi_2$ semiconductor body, is composed of $$(Ti_{0.55}Mo_{0.45})_{0.234}Si_{0.766}$$

55. A contact piece according to claim 1, which for a $FeSi_2$ semiconductor body, is composed of $$(Mo_{0.78}Nb_{0.22})_{0.26}Si_{0.74}$$

56. A contact piece according to claim 1, which for a MnSi semiconductor body, is composed of $$(Pd_{0.58}Mo_{0.42})_{0.32}Si_{0.68}$$

57. A contact piece according to claim 1, which for a MnSi semiconductor body, is composed of $$(Co_{0.54}W_{0.46})_{0.32}Si_{0.68}$$

58. A contact piece according to claim 1, which for a MnSi semiconductor body, is composed of $$(W_{0.51}Ni_{0.49})_{0.32}Si_{0.68}$$

59. The contact piece of claim 1, which in addition to palladium and silicon, contains as a third alloying component one of the metals $Me^{I}$ and $Me^{II}$, present in the contact piece, as a solder for contacting with a semiconductor body.

References Cited

UNITED STATES PATENTS

| | | | |
|---|---|---|---|
| 2,955,145 | 10/1960 | Schrewelius | 136—239 |
| 3,072,733 | 1/1963 | Sasaki et al. | 136—239 |
| 3,166,409 | 1/1965 | Hubbard | 75—134 |
| 3,298,777 | 1/1967 | Brixner | 23—315 |
| 3,361,560 | 1/1968 | Severns et al. | 75—170 |
| 3,496,027 | 2/1970 | Dingwall et al. | 136—205 |

L. DEWAYNE RUTLEDGE, Primary Examiner

E. L. WEISE, Assistant Examiner

U.S. Cl. X.R.

23—315; 75—213; 136—239